(12) United States Patent
Yu et al.

(10) Patent No.: US 11,880,052 B2
(45) Date of Patent: Jan. 23, 2024

(54) STRUCTURE AND METHOD OF MIRROR GROUNDING IN LCOS DEVICES

(71) Applicant: Applied Materials, Inc., Santa Clara, CA (US)

(72) Inventors: Lan Yu, Albany, NY (US); Benjamin D. Briggs, Clifton Park, NY (US); Tyler Sherwood, Fonda, NY (US); Raghav Sreenivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/100,416

(22) Filed: Nov. 20, 2020

(65) Prior Publication Data

US 2022/0163707 A1 May 26, 2022

(51) Int. Cl.
| | |
|---|---|
| *G02B 5/08* | (2006.01) |
| *H01L 33/46* | (2010.01) |
| *H01L 23/48* | (2006.01) |
| *H01L 33/10* | (2010.01) |
| *G02F 1/1335* | (2006.01) |
| *G02F 1/1362* | (2006.01) |

(52) U.S. Cl.
CPC .......... *G02B 5/0808* (2013.01); *H01L 23/481* (2013.01); *H01L 33/10* (2013.01); *H01L 33/46* (2013.01); *G02F 1/133553* (2013.01); *G02F 1/136277* (2013.01)

(58) Field of Classification Search
CPC ...... G02B 5/0808; G02B 5/18; G02B 5/1814; G01F 1/136277; H01L 33/10; H01L 33/46

USPC .......................... 359/838; 257/774, 775, 776
See application file for complete search history.

(56) References Cited

U.S. PATENT DOCUMENTS

| | | | |
|---|---|---|---|
| 5,170,407 A | 12/1992 | Schubert et al. | |
| 5,892,563 A | 4/1999 | Ono et al. | |
| 5,903,058 A | * 5/1999 | Akram | H01L 24/11 |
| | | | 438/959 |
| 6,008,876 A | 12/1999 | Moore | |

(Continued)

FOREIGN PATENT DOCUMENTS

| | | |
|---|---|---|
| CN | 101398579 B | 6/2010 |
| CN | 101866083 B | 5/2012 |

(Continued)

OTHER PUBLICATIONS

International Search Report and Written Opinion dated Mar. 4, 2022 in International Patent Application No. PCT/US2021/059737, 8 pages.

(Continued)

*Primary Examiner* — Ricky D Shafer
(74) *Attorney, Agent, or Firm* — Kilpatrick Townsend & Stockton LLP

(57) ABSTRACT

Processing methods may be performed to form a grounded mirror structure on a semiconductor substrate. The methods may include revealing a metal layer. The metal layer may underlie a spacer layer. The metal layer may be revealed by a dry etch process. The method may include forming a mirror layer overlying the spacer layer and the metal layer. The mirror layer may contact the metal layer. The method may also include forming an oxide inclusion overlying a portion of the mirror layer. The portion of the mirror layer may be external to the spacer layer.

6 Claims, 9 Drawing Sheets

(56) References Cited

U.S. PATENT DOCUMENTS

| | | | |
|---|---|---|---|
| 6,333,519 | B1 | 12/2001 | Nakazawa |
| 6,356,332 | B1 | 3/2002 | Ichikawa et al. |
| 6,435,942 | B1 | 8/2002 | Jin et al. |
| 6,577,362 | B1 | 6/2003 | Moore |
| 6,795,144 | B1 | 9/2004 | Okuda et al. |
| 7,928,579 | B2 * | 4/2011 | Wark .................. H01L 25/50 |
| | | | 257/723 |
| 11,322,910 | B2 | 5/2022 | Park et al. |
| 11,573,452 | B2 * | 2/2023 | Yu .................... G02F 1/133553 |
| 11,586,067 | B2 * | 2/2023 | Yu .................... G02F 1/133553 |
| 2001/0045999 | A1 | 11/2001 | Nakazawa et al. |
| 2002/0126233 | A1 | 9/2002 | Yamagishi et al. |
| 2002/0175414 | A1 | 11/2002 | Teh et al. |
| 2004/0017537 | A1 | 1/2004 | Magana et al. |
| 2005/0134753 | A1 | 6/2005 | Higuchi et al. |
| 2007/0026557 | A1 | 2/2007 | Yu et al. |
| 2007/0026679 | A1 | 2/2007 | Yu et al. |
| 2007/0170430 | A1 | 7/2007 | Nakagawa |
| 2007/0175104 | A1 | 8/2007 | Nishiyama et al. |
| 2007/0262463 | A1 * | 11/2007 | Akram .............. H01L 23/49811 |
| | | | 438/618 |
| 2007/0284627 | A1 | 12/2007 | Kimura |
| 2007/0287211 | A1 | 12/2007 | Wu |
| 2011/0237009 | A1 | 9/2011 | Huang et al. |
| 2012/0081645 | A1 | 4/2012 | Yoshimura et al. |
| 2013/0027651 | A1 | 1/2013 | Meldrim |
| 2015/0048514 | A1 * | 2/2015 | Tang .................... H01L 21/768 |
| | | | 257/774 |
| 2016/0111324 | A1 | 4/2016 | Chiu et al. |
| 2017/0075166 | A1 | 3/2017 | Son et al. |
| 2018/0190878 | A1 | 7/2018 | Li et al. |
| 2018/0337090 | A1 | 11/2018 | Shen et al. |
| 2018/0351035 | A1 | 12/2018 | Chung et al. |
| 2019/0164944 | A1 | 5/2019 | Chae et al. |
| 2020/0152691 | A1 | 5/2020 | Lee |
| 2022/0163707 | A1 | 5/2022 | Yu et al. |
| 2022/0163834 | A1 | 5/2022 | Yu et al. |
| 2022/0163845 | A1 | 5/2022 | Yu et al. |
| 2022/0163846 | A1 | 5/2022 | Yu et al. |
| 2022/0165912 | A1 * | 5/2022 | Yu .................... H01L 33/0095 |
| 2022/0223402 | A1 | 7/2022 | Yu et al. |
| 2022/0283452 | A1 | 9/2022 | Nelson |
| 2022/0285425 | A1 | 9/2022 | Young et al. |

FOREIGN PATENT DOCUMENTS

| | | |
|---|---|---|
| CN | 108845442 A | 11/2018 |
| JP | 2000-124313 A | 4/2000 |
| JP | 2007-193200 A | 8/2007 |
| JP | 2011-123093 A | 6/2011 |
| TW | 200415550 A | 8/2004 |
| TW | 200744127 A | 12/2007 |
| TW | 200834197 A | 8/2008 |
| TW | 200842400 A | 11/2008 |
| TW | 200916406 A | 4/2009 |
| TW | 201001009 A | 1/2010 |
| TW | 201218274 A | 5/2012 |
| TW | 202039719 A | 11/2020 |
| WO | 2020-008765 A1 | 1/2020 |

OTHER PUBLICATIONS

International Search Report and Written Opinion dated Mar. 8, 2022 in International Patent Application No. PCT/US2021/059744, 8 pages.

International Search Report and Written Opinion dated Mar. 15, 2022 in International Patent Application No. PCT/US2021/059756, 6 pages.

International Search Report and Written Opinion dated Mar. 15, 2022 in International Patent Application No. PCT/US2021/059752, 6 pages.

International Search Report and Written Opinion dated Apr. 29, 2022 in International Patent Application No. PCT/US2022/011847, 7 pages.

International Preliminary Report on Patentability dated May 16, 2023, in International Patent Application No. PCT/US2021/059752, 4 pages.

International Preliminary Report on Patentability dated Jul. 4, 2023, in International Patent Application No. PCT/US2022/011847, 5 pages.

International Preliminary Report on Patentability dated May 16, 2023, in International Patent Application No. PCT/US2021/059737, 5 pages.

International Preliminary Report on Patentability dated May 16, 2023, in International Patent Application No. PCT/US2021/059744, 5 pages.

International Preliminary Report on Patentability dated May 16, 2023, in International Patent Application No. PCT/US2021/059756, 4 pages.

* cited by examiner

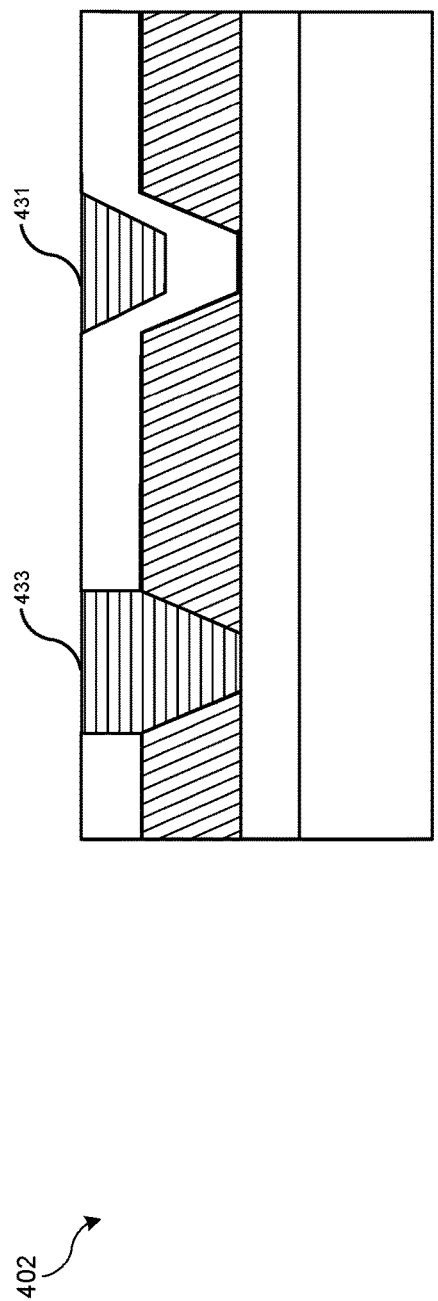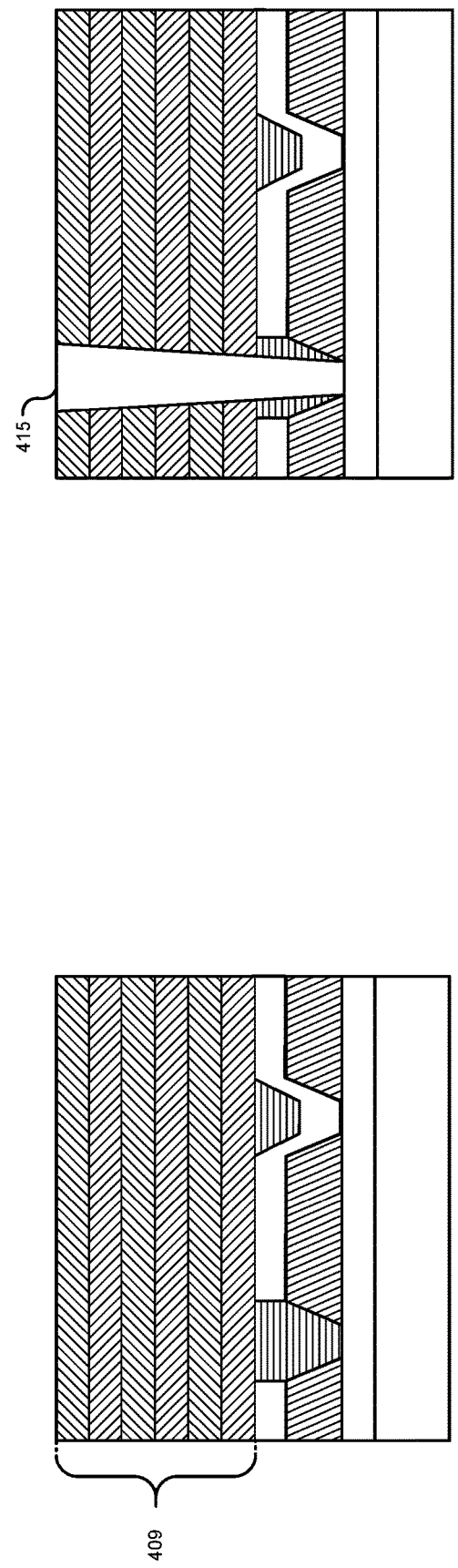
FIG. 4H
FIG. 4I
FIG. 4J

STRUCTURE AND METHOD OF MIRROR GROUNDING IN LCOS DEVICES

CROSS-REFERENCES TO RELATED APPLICATIONS

The present technology is related to the following applications, all concurrently filed Nov. 20, 2020, and titled: "STRUCTURE AND METHOD OF ADVANCED LCOS BACK-PLANE HAVING HIGHLY REFLECTIVE PIXEL VIA METALLIZATION" U.S. patent application Ser. No. 17/100,402), "STRUCTURE AND METHOD OF ADVANCED LCOS BACK-PLANE HAVING ROBUST PIXEL VIA METALLIZATION" U.S. patent application Ser. No. 17/100,407), "STRUCTURE AND METHOD OF BI-LAYER PIXEL ISOLATION IN ADVANCED LCOS BACK-PLANE", U.S. patent application Ser. No. 17/100, 400), and "METHOD FOR LCOS DBR MULTILAYER STACK PROTECTION VIA SACRIFICIAL HARDMASK FOR RIE AND CMP PROCESSES" U.S. patent application Ser. No. 17/100,422). The present technology is also related to "METHOD OF CMP INTEGRATION FOR IMPROVED OPTICAL UNIFORMITY IN ADVANCED LCOS BACK-PLANE" U.S. patent application Ser. No. 17/149,399), filed Jan. 14, 2021. Each of these applications is hereby incorporated by reference in their entirety for all purposes.

TECHNICAL FIELD

The present technology relates to semiconductor systems, processes, and equipment. More specifically, the present technology relates to processes and systems for forming and etching material layers on a semiconductor substrate.

BACKGROUND

Advanced liquid crystal on silicon (LCoS) devices are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Multilayer LCoS structures, such as those incorporating distributed Bragg reflectors (DBRs), may accumulate charges during high frequency switching of an LCoS pixel. For example, a floating conductive mirror interposed between a metal contact layer and a DBR may develop a surface charge that may cause a shielding effect. This shielding effect may reduce a voltage applied to a liquid crystal layer of the LCoS structure, and may induce a voltage latchup, describing a condition whereby the liquid crystal layer is unresponsive to a display control signal. In display systems, LCoS devices may include an array of individually addressable pixels sharing a common mirror layer, which creates a challenge to include a structure to limit voltage latchup without impairing the operation of the pixels or the optical performance of the display. As such, approaches for limiting charge accumulation within the LCoS structure are desirable for reducing voltage latchup.

Thus, there is a need for improved systems and methods that can be used to produce high quality devices and structures. These and other needs are addressed by the present technology.

SUMMARY

Processing methods may be performed to form a grounded mirror structure on a semiconductor substrate. The methods may include revealing a metal layer. The metal layer may underlie a spacer layer. The metal layer may be revealed by a dry etch process. The method may include forming a mirror layer overlying the spacer layer and the metal layer. The mirror layer may contact the metal layer. The method may also include forming an oxide inclusion overlying a portion of the mirror layer. The portion of the mirror layer may be external to the spacer layer.

In some embodiments, the mirror layer may form an electrically conductive contact with the metal layer. In some embodiments, revealing the metal layer may include forming a lithographic mask overlying the spacer layer. The lithographic mask may include a window. Revealing the metal layer may also include etching a trench through the window. The trench may have a sloped sidewall extending to the metal layer. In some embodiments, forming the mirror layer may include depositing a conformal coating of a metal overlying the spacer layer and the trench. A floor of the trench may be formed by the metal layer. In some embodiments, forming the oxide inclusion may include forming an oxide layer. The oxide layer may be conformal with the mirror layer. Forming the oxide inclusion may also include removing a portion of the oxide layer to reveal the mirror layer. The portion of the oxide layer may be external to the trench. In some embodiments, forming the oxide inclusion may include flowing tetraethyl orthosilicate over the mirror layer. Forming the oxide inclusion may include forming a silicon oxide layer from the tetraethyl orthosilicate on the mirror layer. Forming the oxide inclusion may also include removing a portion of the silicon oxide layer. Removing the portion of the silicon oxide layer may reveal the mirror layer external to the trench. In some embodiments, the oxide inclusion may be a first oxide inclusion, and the method may include etching a via through the mirror layer. The method may include filling the via with a second oxide inclusion. The method may include forming a distributed Bragg Reflector (DBR) overlying the mirror layer and the oxide inclusion. The method may include etching a second via through the DBR, the second oxide inclusion, and the spacer layer. The method may also include filling the second via with a metal.

The present technology also encompasses semiconductor structures including a semiconductor substrate. The structures may include a metal layer overlying the semiconductor substrate. The structures may include a spacer layer defining a via. The via may be characterized by a sloped sidewall extending to the metal layer. The via may be characterized by a floor comprising an upper surface of the metal layer. The structures may include a mirror layer overlying the spacer layer, the sidewall, and the floor. The mirror layer may define a recess at a position of the via. The structures may also include an oxide inclusion filling the recess.

In some embodiments, the mirror layer may include aluminum. The oxide inclusion may be or include an oxide material. The oxide inclusion may be or include silicon oxide. In some embodiments, the sloped sidewall may be a first sloped sidewall. The via may characterized by a second sloped sidewall extending toward the metal layer. The via may taper toward the metal layer. In some embodiments, the via may be a first via, the oxide inclusion may be a first oxide inclusion, and the structures may include a second via formed in the mirror layer. The second via may be formed lateral to the first via. The structures may also include a second oxide inclusion filling the second via. The second oxide inclusion and the first oxide inclusion may be or include an oxide material. In some embodiments, the structures may include a distributed Bragg Reflector (DBR) overlying the mirror layer and the oxide inclusion. The structures may also include a metal pixel via extending between an upper surface of the DBR and the metal layer. The metal pixel via may be electrically isolated from the mirror layer.

The present technology also encompasses semiconductor structures including a semiconductor substrate. The structures may include a metal layer overlying the semiconductor substrate. The structures may include a spacer layer overlying the metal layer. The structures may include a mirror layer overlying the spacer layer. The structures may include a metal pixel via formed through the spacer layer and the mirror layer. The metal pixel via may be in electrical contact with the mirror layer.

In some embodiments, the metal pixel via may be in electrical contact with the mirror layer at a sidewall of the metal pixel via. The metal pixel via may be in electrical contact with the metal layer. The mirror layer may be or include a non-refractory metal. The mirror layer may be or include aluminum. The structures may include a distributed Bragg Reflector (DBR) overlying the mirror layer. The metal pixel via may extend through the DBR to an upper surface of the DBR.

Such technology may provide numerous benefits over conventional systems and techniques. For example, embodiments of the present technology may exhibit reduced shielding effects and improved performance with regard to voltage latchup on a scale of a display. These and other embodiments, along with many of their advantages and features, are described in more detail in conjunction with the below description and attached figures.

BRIEF DESCRIPTION OF THE DRAWINGS

FIGS. 4A-4J illustrate schematic cross-sectional views of substrate materials on which selected operations are being performed according to some embodiments of the present technology.

Figure 1:
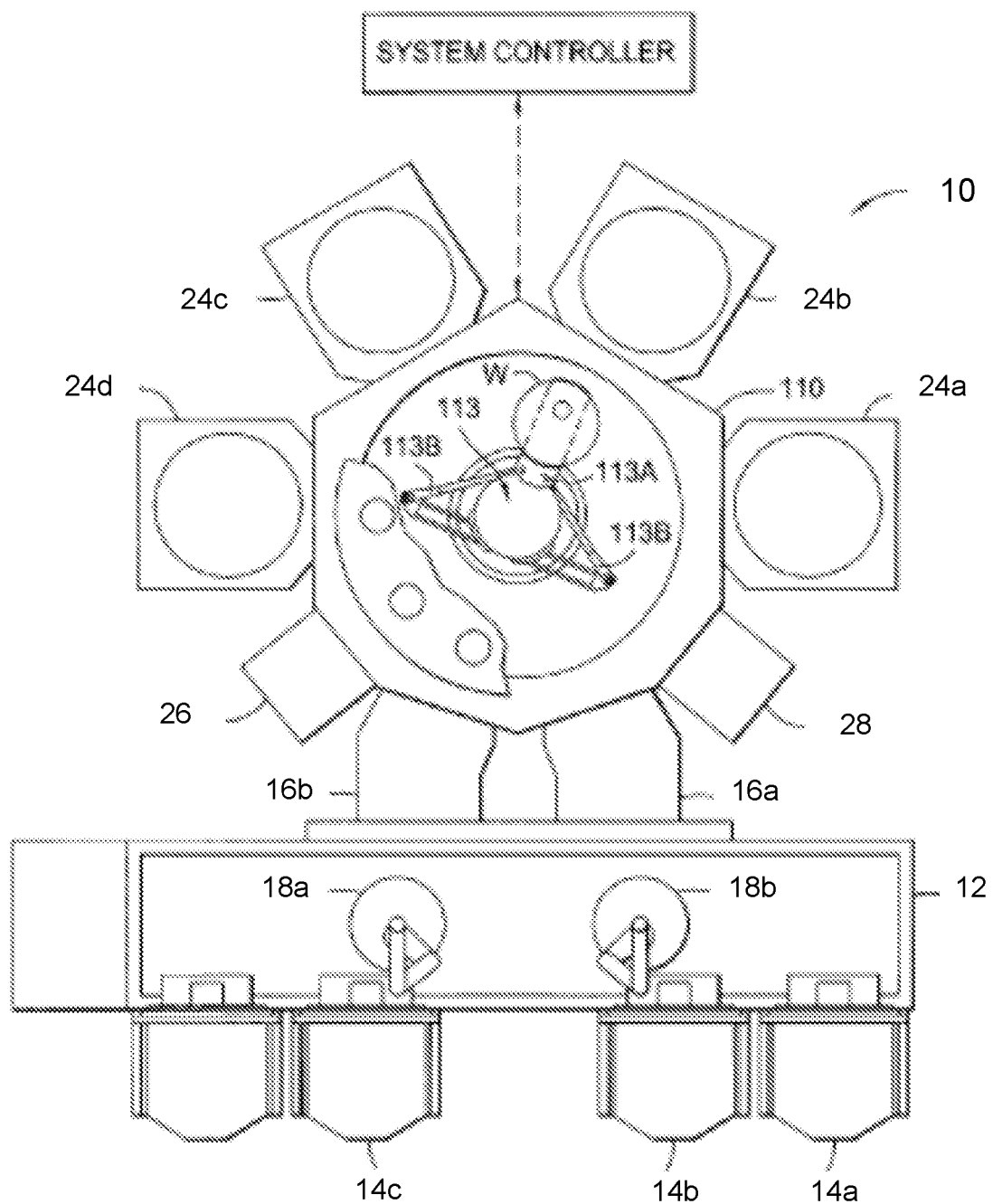
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of liquid crystal on silicon (LCoS) back-plane devices. Semiconductor structures built with an embedded distributed Bragg reflector (DBR) can have dramatically enhanced optical performance for increased display brightness and lower power consumption relative to other reflective back-plane structures for liquid crystal displays. Incorporating a DBR layer in the LCoS back-plane can add complexity to fabrication processes, and may create challenges for operating an addressable pixel that undergoes high-frequency switching of the liquid crystal state. For example, the liquid crystal layer in a pixel may transition from opaque to transparent, or vice versa, under an applied voltage provided by a metal contact layer in the LCoS backplane.

A reflective metal mirror layer overlying the metal contact layer may be included to improve optical performance of the LCoS backplane. During operation, as much as 10-20 V may be applied to the liquid crystal layer. While switching between opaque and transparent states, the metal mirror layer may develop a surface charge. Accumulated charge may in turn cause a shielding effect that reduces the voltage applied to the liquid crystal layer. This shielding effect may also induce a voltage latchup, whereby the LCoS structure is unresponsive to voltage switching.

In display systems, LCoS devices may include multiple individually addressable pixels that share a common mirror layer. The common mirror layer may present a challenge to including a structure to limit voltage latchup without impairing the operation of constituent pixels. Another challenge may be presented by incorporating the structure without impairing the optical performance of the display. As such, approaches for reducing charge accumulation within the LCoS structure are desirable for reducing voltage latchup.

The present technology overcomes such limitations through an improved mirror structure in an LCoS backplane. In some embodiments, wafer scale methods are provided to ground the mirror layer in the LCoS structure, without negatively affecting performance of the mirror layer, the overlying DBR, or an LCoS display system. For example, a conductive contact may be formed between the mirror layer and the metal contact layer during LCoS backplane fabrication. In some embodiments, the conductive contact may be formed before depositing the DBR and may preserve an isolation of a metal pixel via. In some embodiments, the conductive contact may be formed by contacting the mirror layer to a metal pixel via on a sidewall of the metal pixel via, after the DBR has been formed on the mirror layer.

The process of forming the conductive contact may include etching one or more layers of the semiconductor substrate. In some embodiments, etching a dielectric layer may form a sloped sidewall of a trench, the sloped sidewall extending to the metal contact layer. In this way, a mirror layer including a conductive metal, such as aluminum, may be deposited as a conformal layer on the dielectric layer, the sloped sidewall, and the metal contact layer. To reduce the potential impact on DBR performance caused by discontinuities in the surface of the mirror layer, a recess in the mirror layer formed by the trench may be filled by an oxide material. In some embodiments, the mirror layer may be formed as a continuous layer across multiple pixels. As such, the process may be applied at select locations on a wafer, thereby forming multiple contact points between the mirror and the metal contact layer without affecting the fabrication of an array of addressable pixel structures. A mirror layer, thus grounded, may exhibit reduced shielding effects and improved performance with regard to voltage latchup on a scale of a display, and may exhibit limited impact on the optical performance of the display.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figures 1, 2:
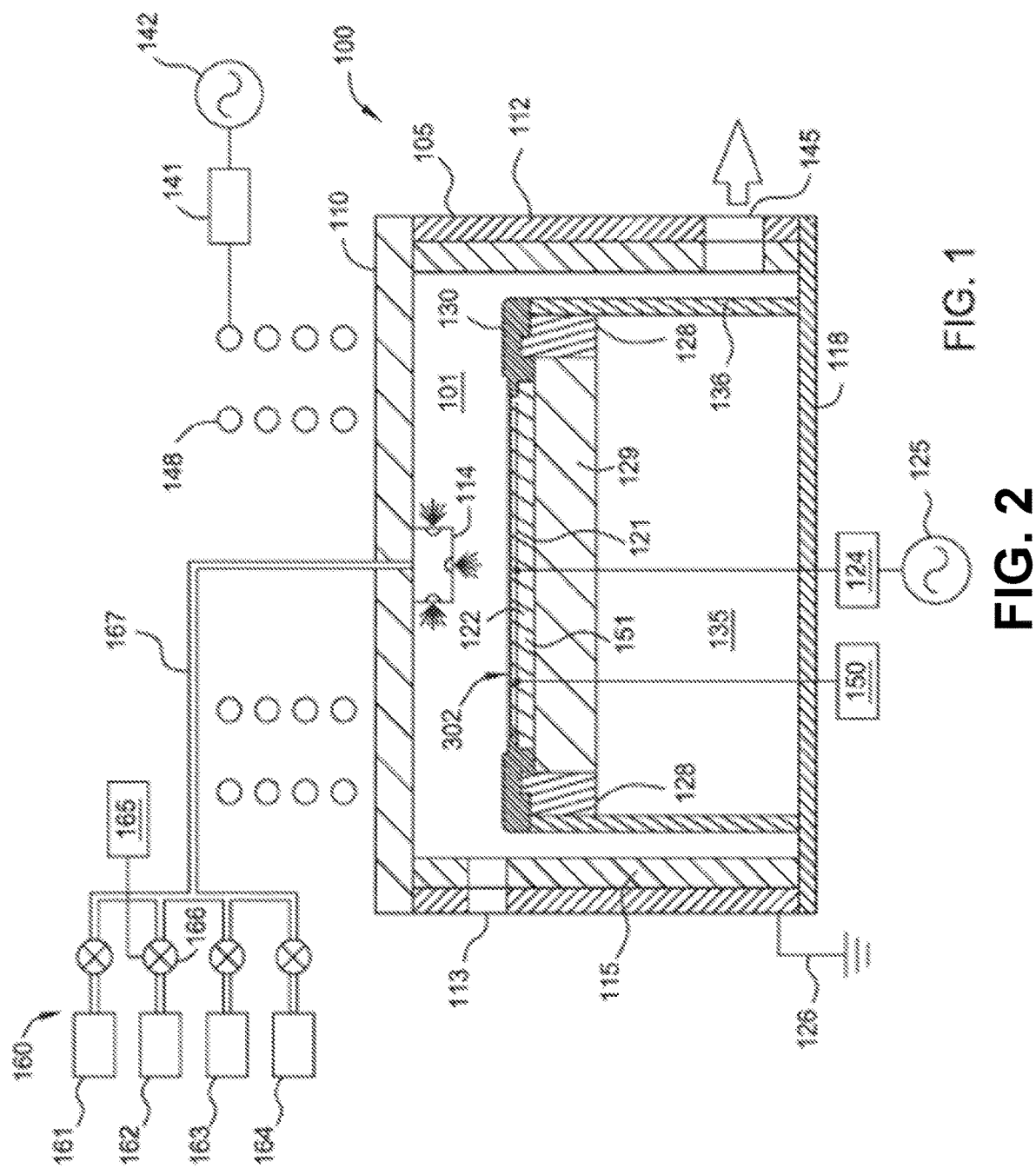
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, tetrafluoromethane, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$ among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
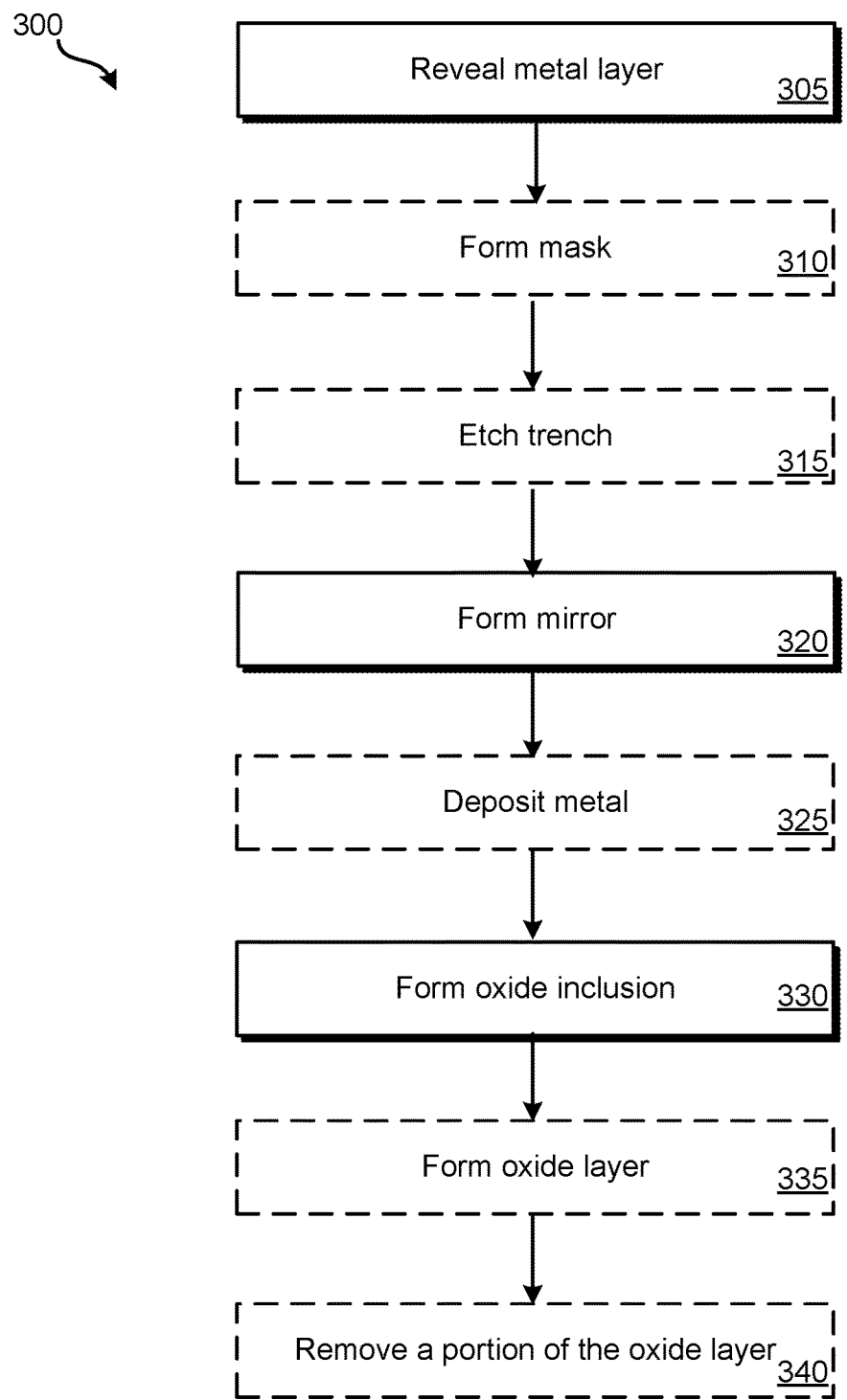
FIG. 3 shows selected operations in a method of forming a grounded mirror structure on a semiconductor substrate according to some embodiments of the present technology.

FIG. 3 shows selected operations in a method 300 of forming a grounded mirror structure on a semiconductor substrate according to some embodiments of the present technology. Many operations of method 300 may be performed, for example, in the chamber 100 as previously described. Method 300 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 300 describes operations shown schematically in FIGS. 4A-4J, the illustrations of which will be described in conjunction with the operations of method 300. It is to be understood that FIG. 4 illustrates only partial schematic views, and a substrate may contain any number of semiconductor sections having aspects as illustrated in the figures, as well as alternative structural aspects that may still benefit from aspects of the present technology. Method 300 may involve optional operations to develop the semiconductor structures to a particular fabrication operation.

Figure 4A:
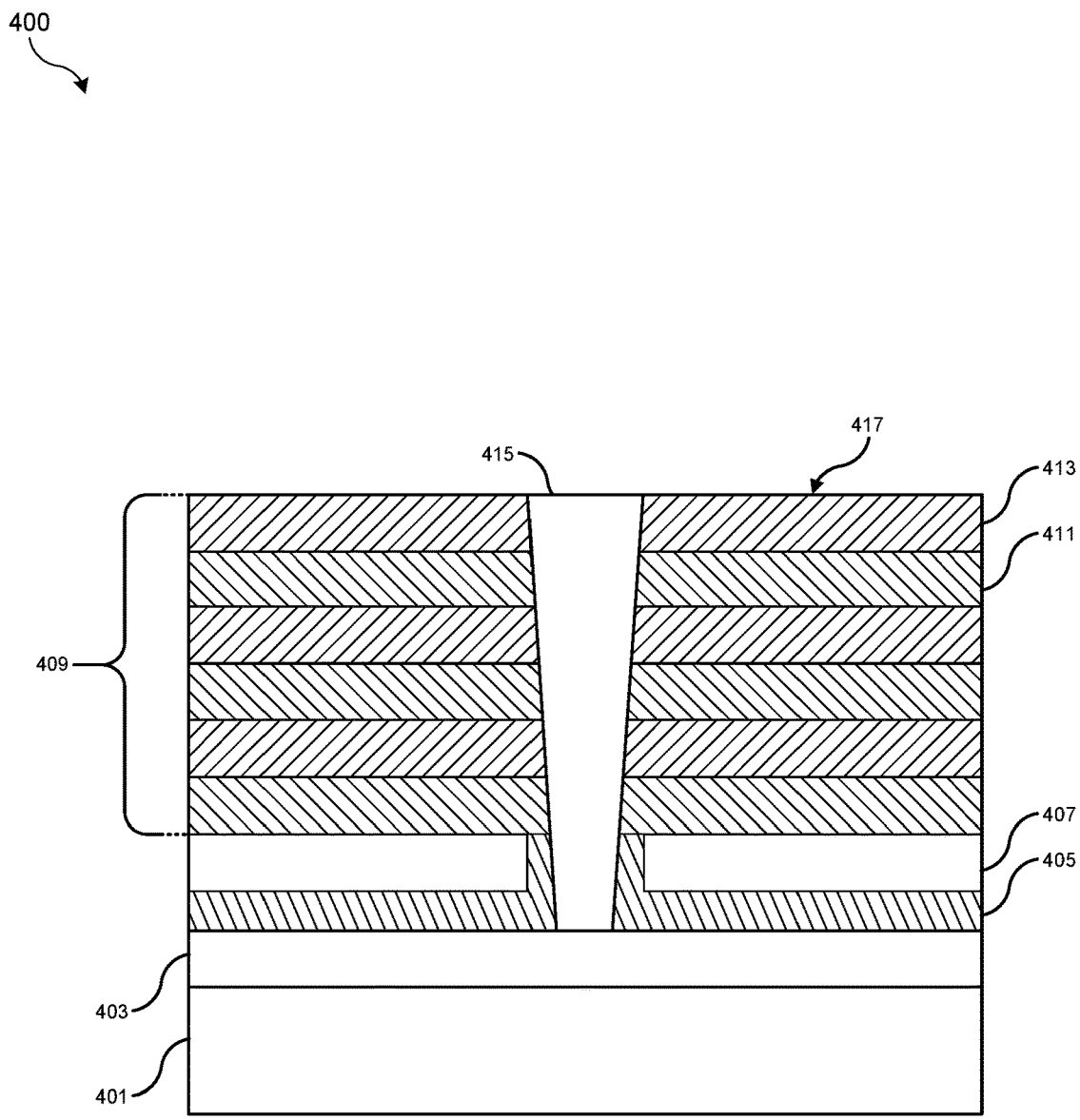

In the context of method 300, the semiconductor structure 400 may define an active pixel, where the active pixel is described in reference to FIG. 4A. At one or more points in the formation processes leading to the semiconductor structure 400, the operations of method 300 may be implemented to form a conductive contact between constituent layers of the semiconductor structure 400, as described in reference to FIGS. 4B-4J. The operations described below may be localized to specific regions of an LCoS substrate, such that a display may include both active pixels, illustrated in FIG. 4A, and grounded pixels, illustrated in FIG. 4J, potentially resulting in negligible impact on the performance of a display device including both types of pixels. A resulting display device, formed by a process including the operations of method 300, may incorporate a semiconductor structure 400 having a grounded mirror, and may therefore exhibit reduced voltage latchup.

As illustrated in FIG. 4A, the semiconductor structure 400 may represent a liquid crystal on silicon (LCoS) back-plane comprising one or more constituent structures forming an active pixel. As illustrated, structure 400 may include a substrate 401 made of or containing silicon or some other semiconductor substrate material, on which the one or more structures of the LCoS back-plane may be formed. For example, structure 400 may include a metal contact layer 403, formed, for example, from copper or another metal compatible with semiconductor processing techniques. Structure 400 may further include a reflective and conductive mirror layer 407 that may be or include aluminum, copper, or another reflective metal suitable for providing a mirror surface. To electrically insulate the mirror layer 407 from the metal contact layer 403, a spacer material 405 may be formed overlying the metal contact layer 403 prior to forming the conductive mirror layer 407. As illustrated, a distributed Bragg grating 409 (DBR) may be formed overlying the conductive mirror layer 407. The DBR 409 may include multiple alternating layers of high-k and low-k dielectric materials. For example, low-k layers 411 may be or include a low-k dielectric material, such as silicon oxide or organosilicate glass. By contrast, high-k layers 413 may be or include a high-k dielectric material, such as tantalum oxide. For further implementation in LCoS devices, the semiconductor structure may include a pixel via 415. As illustrated, the pixel via 415 may extend from an upper surface 417 of the structure 400 and contact the metal contact layer 403, which may provide a conductive path between the metal contact layer 403 and the upper surface 417, through an aperture in the conductive mirror layer 407 and the DBR 409. As described in more detail in reference to the forthcoming figures, the pixel via 415 may be or include a metal or a refractory material selected for suitability with downstream processing operations such as high-temperature deposition and reactive ion etching.

Figure 4B:
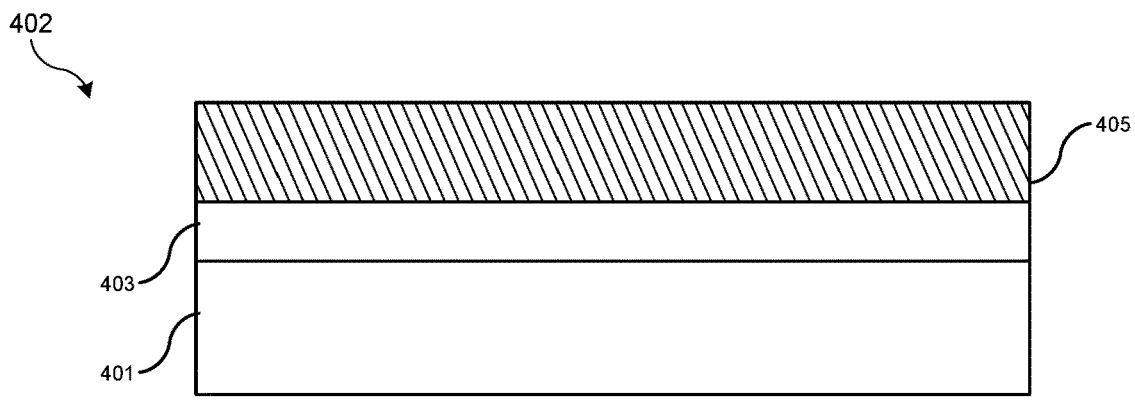

In some embodiments, the mirror layer 407 may be physically separated from active electrical components of the structure 400 to prevent a short-circuit from affecting multiple pixels, as when the mirror layer 407 spans multiple pixels on the LCoS device. For example, in active pixels, the mirror layer 407 may be electrically isolated from the metal contact layer 403 and the pixel via 415. As described above, however, the resulting shielding effect may induce voltage latchup of active pixels. As such, the method 300, described in reference to a grounded pixel structure 402 of FIGS. 4B-4J, may permit the structure 400 to act as an active pixel in an LCoS display without accumulating charge on the mirror layer 407 and without shorting multiple active pixels. As illustrated in FIG. 4B, the operations of method 300 may be implemented during wafer-scale fabrication of an LCoS backplane including the structure 400, to form one or more instances of structure 402. In some embodiments, the method 300 may include processes that are implemented on a wafer scale, such as formation and removal processes, and may also include spatially localized operations implemented in specific regions of a wafer, for example, through application of masking layers and photolithographic techniques.

Figure 4C:
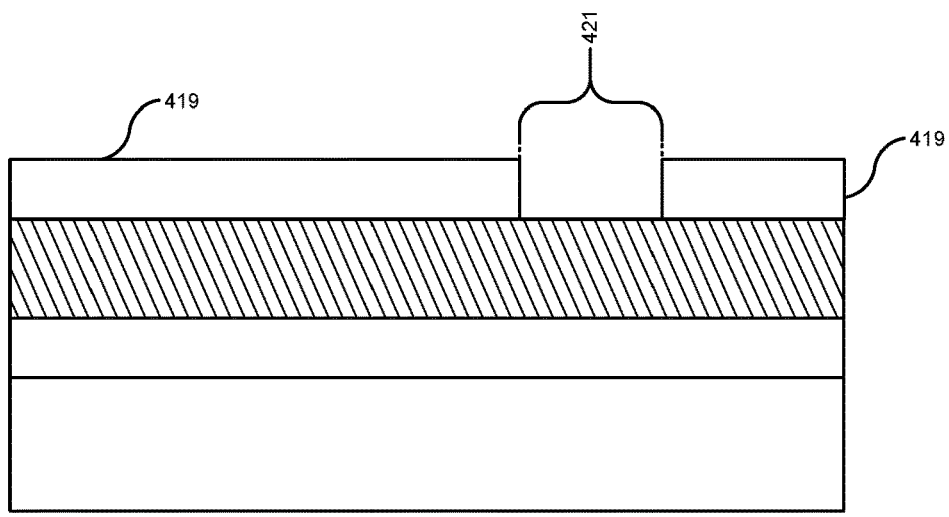
Figure 4D:
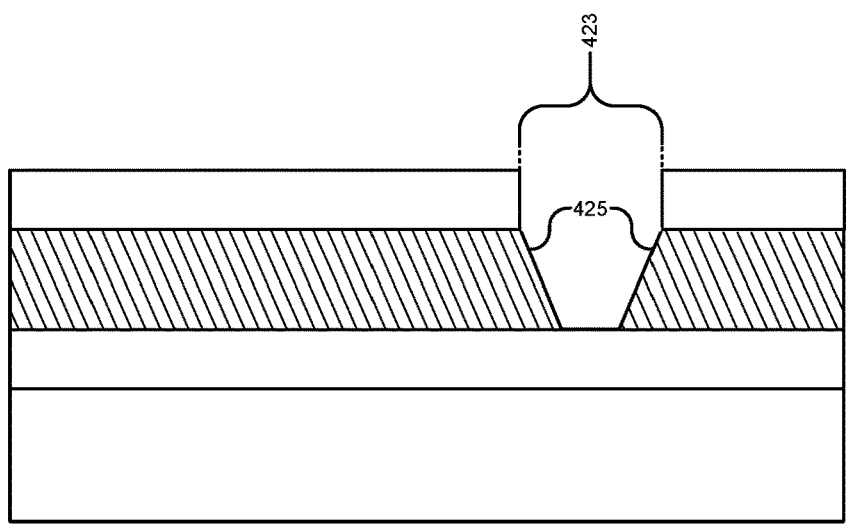

The method 300 may be implemented on a semiconductor substrate including the silicon substrate 401, the metal contact layer 403, and the spacer material 405, as illustrated in FIG. 4B. As described above, the method 300 may be implemented in a specific location on a wafer including multiple structures of a multi-pixel device. At operation 305, the metal contact layer 403 may be revealed by one or more processes, as illustrated in FIGS. 4B-4D. For example, the operation 305 may include, but is not limited to, wet chemical etch processes, dry etch processes, ablation, ion-milling, or other process techniques facilitating localized removal of the spacer material 405. The removal may produce a trench 423 having a sloped sidewall 425, as illustrated in FIG. 4D, and as described in more detail, below.

In some embodiments, operation 305 may include optional operations. For example, operation 305 may include operation 310, whereby a lithographic mask 419 may be formed over the exposed structures as illustrated in FIG. 4C. The lithographic mask 419 may be or include a hardmask or a softmask, and may include a window 421 formed in the lithographic mask 419. Operation 305 may also include operation 315, whereby a trench 423 may be formed in the spacer material 405. The trench 423 may be formed by a dry etch process through the window 421 and may be spatially restricted to form the trench or via through the spacer material 405 to reveal the metal contact layer 403, as illustrated in FIG. 4D. In some embodiments, as when the spacer material is an oxide, the dry etch process may include an oxide selective etch that removes the spacer material 405 while leaving the metal contact layer 403.

The process may be performed using a dry etch process utilizing a plasma or remote plasma, which may produce plasma effluents of a halogen-containing precursor, such as, for example, a fluorine-containing precursor, or a chlorine-containing precursor. For example, the halogen-containing precursor may be or include tetrafluoromethane or fluoromethane. The process may also utilize a hydrogen-containing precursor in embodiments or an oxygen-containing containing precursor in embodiments, which may also be included in the remote plasma or may bypass the remote plasma to interact with radical halogen-containing plasma effluents in the processing region. The process may be performed below about 10 Torr in embodiments, and may be performed below or about 5 Torr in embodiments. The process may also be performed at a temperature below about 100° C. in embodiments, and may be performed below about 50° C.

In some embodiments, the trench 423 may be tapered toward the metal contact layer 403. For example, the trench 423 may include one or more sidewalls 425, formed in the spacer material 405, that slope toward the metal contact layer 403. As illustrated in FIG. 4D, the sidewalls 425 may slope at a nonzero angle relative to a normal direction of a surface of the metal layer, and the trench 423 may taper towards the floor of the trench. A tapered trench 423 may be formed during a dry etch process by controlling etch conditions, for example, by implementing a diffusion-limited etch condition that is selective to the spacer material 405.

While FIG. 4D shows a trench 423 including two sidewalls 425, the trench 423 may be asymmetric and may include a single sidewall 425 or two sidewalls 425 having different slopes. In some embodiments, the trench 423 may have a lateral cross section, in a plane parallel to the substrate 401, that is circular, rectangular, oblong, or another shape, as may result from a form of the window 421 in the lithographic mask 419. In some embodiments, the dimensions and shape of the trench 423 may be formed to promote deposition of a conformal mirror layer 403, as described in more detail below. For example, the trench may be greater than or about 100 nm wide at the upper surface, greater than or about 200 nm wide at the upper surface, greater than or about 300 nm wide at the upper surface, greater than or about 400 nm wide at the upper surface, or greater. The sidewalls of the trench may be sloped at an angle greater than or about 30 degrees, greater than or about 40 degrees, greater than or about 50 degrees, greater than or about 60 degrees, greater than or about 70 degrees, or greater.

Figure 4E:
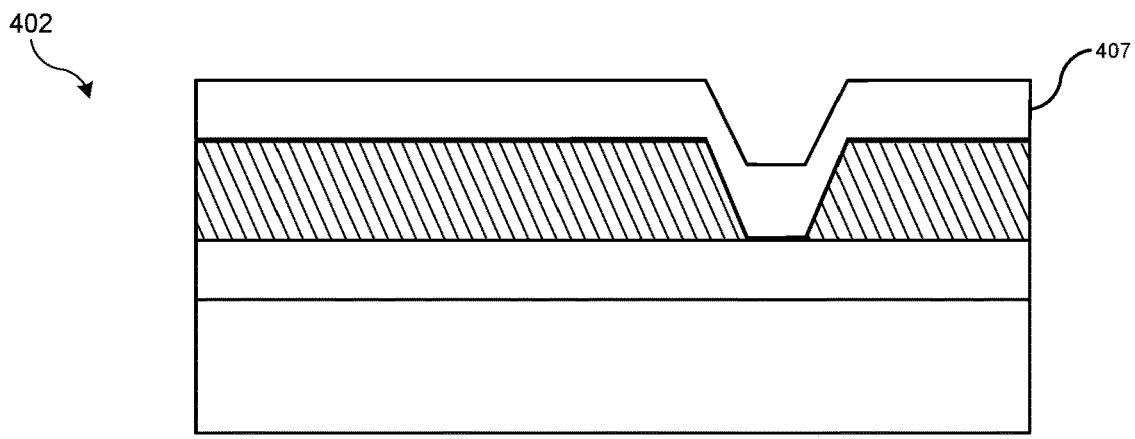

Subsequent to revealing the metal layer, the mirror layer 407 may be formed at operation 320, as illustrated in FIG. 4E. The mirror layer 407 may be formed overlying the spacer material 405 and the trench 423. The mirror layer 407 may contact the metal contact layer 403 in the trench 423. In the context of structure 402, contacting the metal contact layer 403 may include forming an electrical contact, such that charge accumulation on the mirror layer 407 may be mitigated, for example, by grounding the mirror layer 407 through the metal contact layer 403. For example, in a finished LCoS display device, a clearing cycle may be intermittently implemented by display control circuitry to clear the mirror layer 407 of accumulated charges. In some embodiments, the metal contact layer 403 is electrically isolated from structures 400, as when the LCoS backplane is incorporated in an array of addressable pixels, so that the metal contact layer may be grounded without shorting active pixels.

Operation 320 may include one or more processes for forming the mirror layer 407 including, but not limited to, thin film deposition techniques such as sputter coating, ALD, epitaxy, CVD, or PECVD. In some embodiments, operation 320 may include optional operations including operation 325, whereby a metal is deposited as a conformal layer on the structure 402. The mirror layer 407 may be or include a non-refractory metal, such as aluminum, copper, or cobalt, deposited using techniques compatible with semiconductor fabrication processes. In some embodiments, the mirror layer 407 may be deposited on the sidewalls 425 of the trench 423 and on the metal contact layer 403 as well as on the spacer material 405, such that the mirror layer 407 is in electrical contact with the metal contact layer 403. A width of the trench 423 and a slope of the sidewalls 425 may therefore influence the outcome of operation 325. For example, a steep slope of the sidewalls 425, as when the angle of the sidewalls 425 approaches the normal angle of the metal contact layer 403, may result in a discontinuous mirror layer 405. Similarly, a narrow trench 423, either when formed through a narrow window 421 or incorporating a significant taper, may result in the mirror layer 407 not contacting the metal contact layer 403. In some embodiments, the mirror layer 407 is continuous and extends into neighboring pixels in a pixel-array device, which may be active pixels having the structure 400. A conformal coating may improve the performance of the LCoS backplane by removing accumulated charges from neighboring active pixels, for example, by grounding the mirror layer 407 across multiple active pixels.

Figure 4F:
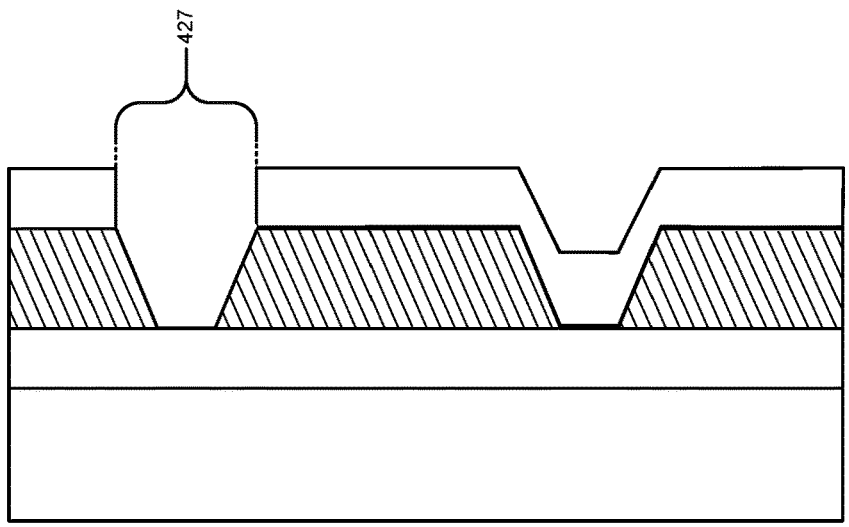

As described above, method 300 may include operations for forming active pixel components, including the DBR 409 and the pixel via 415. In this way, subsequent forming the mirror layer at operation 320, a via 427 may be formed in the mirror layer 407 to facilitate formation of the pixel via 415 as part of LCoS backplane fabrication on a wafer scale, as illustrated in FIG. 4F. For example, in structure 400, the pixel via 415 may be isolated from the mirror layer 407 by a dielectric or oxide material that may differ from the spacer material 405. In some cases, the via 427 may be formed in the mirror layer 407 and may extend into the spacer layer 405, to receive the oxide material 429 prior to forming the DBR 409.

Figure 4G:
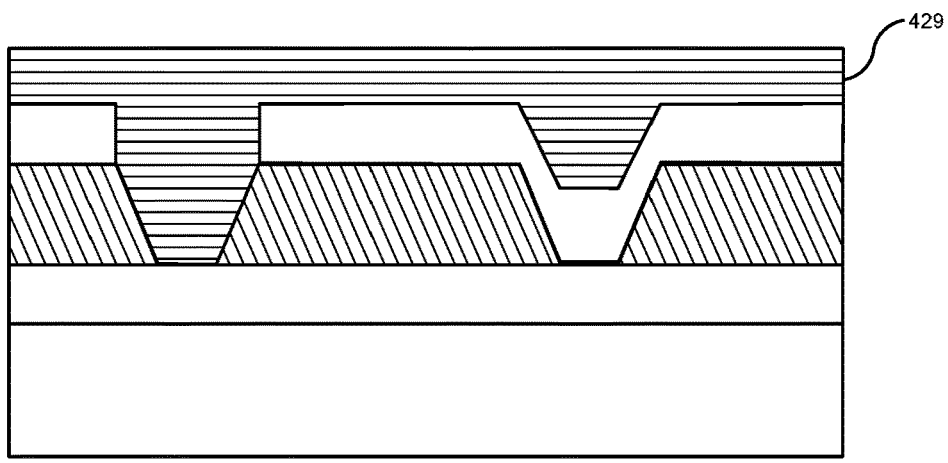

Subsequent forming the mirror layer at operation 320, an oxide inclusion 431 may be formed at operation 330, as illustrated in FIG. 4G-4H. Operation 330 may include forming a layer of oxide material 429 overlying the substrate 401, the metal contact layer 403, the spacer layer 405, and the mirror layer 407, as illustrated in FIG. 4G. In some embodiments, the oxide material 429 may be formed by depositing a silicate material. Deposition processes may include, but are not limited to PVD, CVD, sputtering, PECVD, or other processes compatible with semiconductor fabrication techniques.

Operation 330 may include subsequent removal processes to reveal the mirror layer 407 external to the trench 423. In some embodiments, as when the structure 402 includes the via 429, the removal processes may also reveal the mirror layer 407 external to the via 429. Removal processes may include, but are not limited to, chemical mechanical polishing (CMP), ion beam milling, dry etch, wet etch, or other depth-controlled or selective etch processes selected to permit forming the oxide inclusion 431, illustrated in FIG. 4G.

The structure 402 may include a second oxide inclusion 433, formed by filling the via 427 with the oxide material 429. To potentially limit the effect of the trench 423 and the via 427 on the morphology of the DBR 409, the removal process may provide a level surface across the mirror layer 407 and the oxide inclusion 431. In embodiments incorporating the second oxide inclusion 433, the removal process may similarly provide a level surface across the mirror layer 407 and the second oxide inclusion 431.

In some embodiments, operation 330 may include one or more optional operations including operation 335, whereby the oxide material 429 may be formed by plasma decomposition of tetraethyl orthosilicate (TEOS) to form a silicon oxide layer filling the trench 423 and the via 427, and overlying the mirror layer 407. In some embodiments, the operation 330 may include operation 340, whereby a portion of the silicon oxide may be removed, revealing the mirror layer 407 external to the trench 423 and the via 427. Removal processes of operation 340 may include, but are not limited to, CMP or other techniques compatible with selective removal of silicon oxide, as described above.

Subsequent formation of the oxide inclusion, additional fabrication processes may be implemented to form overlying semiconductor structures, including, but not limited to the DBR 409 and the pixel via 415, as illustrated in FIG. 4I-4J. As described above, such processes may be applied as part of fabricating structure 400 for active pixels, and, as such, may be applied uniformly on a wafer-scale. For that reason, the DBR 409 and the pixel via 415 may provide consistent optical performance, including reflectance, in structure 402 with that of structure 400. As described above, the oxide inclusion 431 may be formed to be appreciably level with the mirror layer 407 to maintain reflectance of the DBR 409, while reducing the visible effect of the trench 423 on the optical performance of structure 402.

Figure 5:
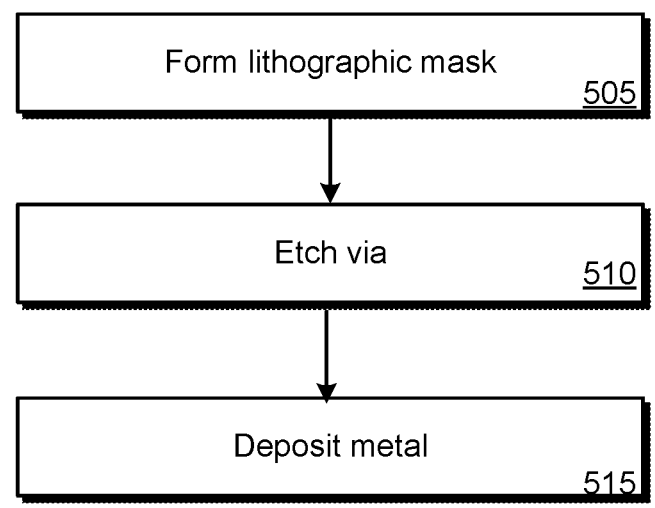
FIG. 5 shows selected operations in another method of forming a forming a grounded mirror on a semiconductor substrate according to some embodiments of the present technology.

FIG. 5 shows selected operations in a method 500 of forming a grounded mirror structure on a semiconductor substrate according to some embodiments of the present technology. Many operations of method 500 may be performed, for example, in the chamber 100 as previously described. Method 500 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 500 describes operations shown schematically in FIGS. 6A-6D, the illustrations of which will be described in conjunction with the operations of method 500. It is to be understood that FIG. 6 illustrates only partial schematic views, and a substrate may contain any number of semiconductor sections having aspects as illustrated in the figures, as well as alternative structural aspects that may still benefit from aspects of the present technology. Method 500 may involve optional operations to develop the semiconductor structure 600 to a particular fabrication operation.

Figure 6A:
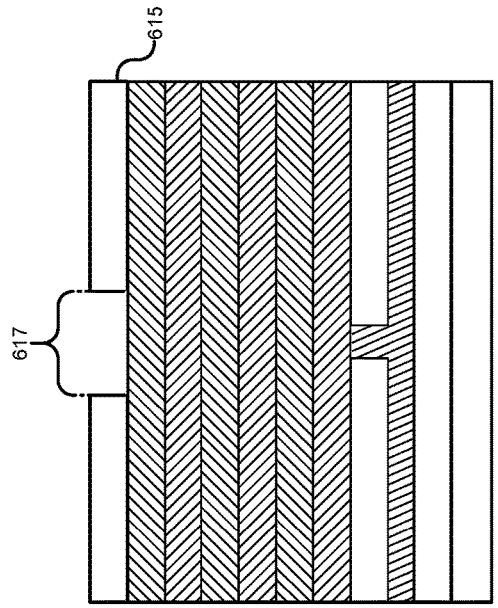
FIGS. 6A-6D illustrates schematic cross-sectional views of substrate materials on which selected operations are being performed according to some embodiments of the present technology.

As described in reference to method 300 and structure 402, one or more operations of method 500 may be implemented during LCoS device fabrication to form a grounded mirror structure. As with structure 402, structure 600 may be formed to provide an avenue to attenuate voltage latchup in the LCoS device in a display application. In contrast to the method 300, however, method 500 may be implemented at a later stage in the fabrication process, after structures such as the mirror layer 407 and the DBR 409 have been formed. As illustrated in FIG. 6A, the structure 600 may include the same or similar structures as those described in reference to structure 400. For example, structure 600 may include a silicon substrate 601, a metal contact layer 603, a spacer material 605, a mirror layer 607, and a DBR 609. In some embodiments, the mirror layer 607 may include a window 611, formed to accommodate a via, as described in more detail in reference to FIG. 4F, above. In contrast to the structures of FIG. 4F, however, the method 500 may provide a pixel via 621 that is in electrical contact with the mirror layer 607, rather than being in electrical isolation from the mirror layer 607 as in structure 400 and structure 402.

Figure 6B:
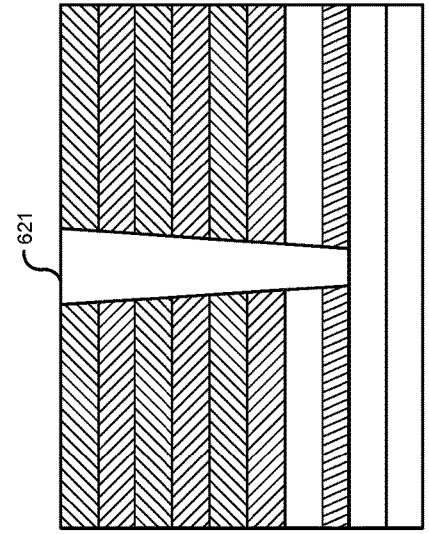

At operation 505, a lithographic mask 615 may be formed on an upper surface 613 of the DBR 609, as illustrated in FIG. 6B. The lithographic mask 615 may include a window 617 at the position of the window 611. The lithographic mask 615 can be or include a softmask, a hard mask, or may be formed from a material selected to shield the underlying surface 613 of the DBR 609 from subsequent etch processes. In some embodiments, the window 617 may have a width corresponding to a maximal width of the pixel via 415 of FIG. 4A.

Figure 6C:
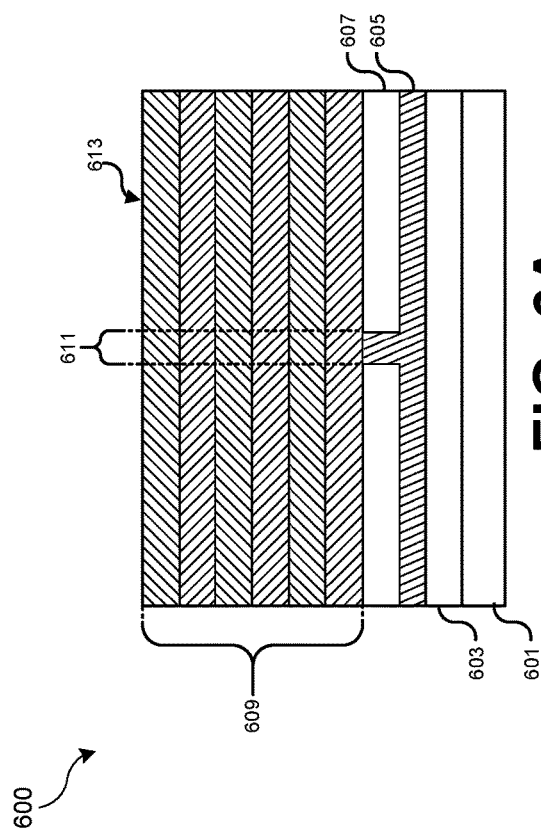

Subsequent forming the lithographic mask 615, a via 619 may be formed at operation 510, as illustrated in FIG. 6C. The via 619 may be formed by a dry etch process to selectively remove portions of the DBR 609, the mirror layer 607, and the spacer material 605, to reveal the metal contact layer 603. The via 619 may taper toward the metal contact layer 603. The taper may facilitate subsequent fill operations and may facilitate forming an electrical connection between the mirror layer 607 and the metal contact layer 603. As illustrated in FIG. 6C, at the mirror layer 607, the via 619 may be laterally wider than the width of the window 611, such that via 619 may form one or more sloped sidewalls extending from the surface of the DBR 613 to the metal contact layer 603.

Figure 6D:
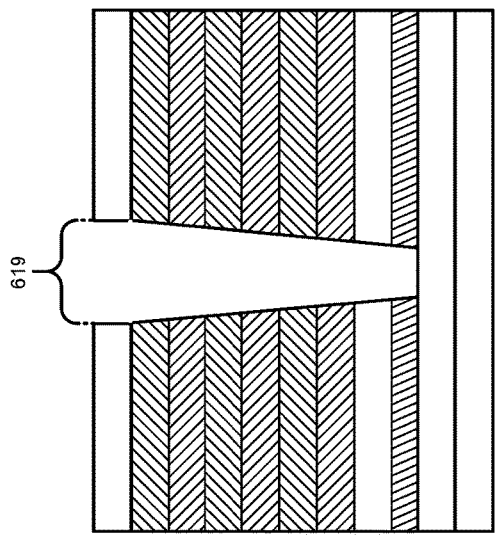

Subsequent forming the via 619, a metal pixel via 621 may be formed at operation 515, as illustrated in FIG. 6D. The metal pixel via 621 may be or include a material, such as a refractory material, selected for stability under semiconductor fabrication processes including, but not limited to, thermal deposition, oxygen etch, or those producing other reactive environments that may induce oxidation, thermal diffusion or other degradation in non-refractory metals. In some embodiments, the metal pixel via 621 can be or include tungsten or ruthenium.

As illustrated in FIG. 6D, the metal pixel via 621 may form an electrical contact with the mirror layer 607 and the metal contact layer 603. The metal pixel via 621 may contact the mirror layer 607 at one or more points on a sidewall of the metal pixel via 621. For example, when the metal pixel via 621 has a circular cross section, such that it forms a frustum of a cone, the periphery of the metal pixel via 621 may form a circular lateral contact with the mirror layer 607. In this way, the metal pixel via 621 may form an electrical contact bridging the metal contact layer 603 and the mirror layer 607, and may facilitate intermittent clearing of accumulated charges from the mirror layer 607 during operation of an LCoS display device incorporating one or more instances of the structure 600. As with the structure 402 described in reference to FIG. 4, the optical performance of structure 600 may be indistinguishable from that of an active pixel having a structure 400 of FIG. 4A. As such, the structure 600 may reduce the occurrence of voltage latchup in LCoS display devices, and thereby improve overall device performance, without attendant impairment of device appearance, for example, by maintaining reflectance and optical performance characteristics of the LCoS backplane.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor structure comprising:
    a semiconductor substrate;
    a metal layer overlying the semiconductor substrate;
    a spacer layer defining a via, wherein the via is characterized by:
        a sloped sidewall extending to the metal layer; and
        a floor comprising an upper surface of the metal layer;
    a mirror layer overlying the spacer layer, the sloped sidewall, and the floor, the mirror layer defining a recess at a position of the via; and
    an oxide inclusion filling the recess;
    a distributed Bragg Reflector (DBR) overlying the mirror layer and the oxide inclusion; and
    a metal pixel via extending between an upper surface of the DBR and the metal layer, the metal pixel being electrically isolated from the mirror layer.

2. The semiconductor structure of claim 1, wherein the mirror layer comprises aluminum.

3. The semiconductor structure of claim 1, wherein the oxide inclusion comprises an oxide material.

4. The semiconductor structure of claim 3, wherein the oxide inclusion comprises silicon oxide.

5. The semiconductor structure of claim 1, wherein:
    the sloped sidewall is a first sloped sidewall;
    the via is characterized by a second sloped sidewall extending toward the metal layer; and
    the via tapers toward the metal layer.

6. The semiconductor structure of claim 1, wherein the via is a first via, the oxide inclusion is a first oxide inclusion, and the semiconductor structure further comprises:
    a second via formed in the mirror layer lateral to the first via; and
    a second oxide inclusion filling the second via, wherein the second oxide inclusion and the first oxide inclusion comprise an oxide material.

* * * * *